(12) United States Patent
Chen

(10) Patent No.: US 8,258,848 B2
(45) Date of Patent: Sep. 4, 2012

(54) LEVEL SHIFTER

(75) Inventor: Yen-Huei Chen, Jhudong Township, Hsinchu County (TW)

(73) Assignee: Taiwan Semiconductor Manufacturing Co., Ltd., Hsin-Chu (TW)

(\*) Notice: Subject to any disclaimer, the term of this patent is extended or adjusted under 35 U.S.C. 154(b) by 77 days.

(21) Appl. No.: 12/876,317

(22) Filed: Sep. 7, 2010

(65) Prior Publication Data

US 2012/0056656 A1    Mar. 8, 2012

(51) Int. Cl.
*H03L 5/00* (2006.01)
(52) U.S. Cl. .................. 327/333; 326/68; 326/81
(58) Field of Classification Search .............. 327/333; 326/68, 80, 81; 365/189.11
See application file for complete search history.

(56) References Cited

U.S. PATENT DOCUMENTS

| | | | |
|---|---|---|---|
| 5,994,177 A | 11/1999 | Wong et al. | |
| 6,124,618 A | 9/2000 | Wong et al. | |
| 6,414,534 B1 | 7/2002 | Wang et al. | |
| 6,489,828 B1 | 12/2002 | Wang et al. | |
| 6,556,061 B1 | 4/2003 | Chen et al. | |
| 6,650,168 B1 | 11/2003 | Wang et al. | |
| 6,706,571 B1 | 3/2004 | Yu et al. | |
| 6,858,478 B2 | 2/2005 | Chau et al. | |
| 6,894,472 B2 * | 5/2005 | Chen | 326/81 |
| 7,151,400 B2 | 12/2006 | Chen | |
| 7,190,050 B2 | 3/2007 | King et al. | |
| 7,247,887 B2 | 7/2007 | King et al. | |
| 7,248,076 B2 | 7/2007 | Chen et al. | |
| 7,265,008 B2 | 9/2007 | King et al. | |
| 7,283,406 B2 | 10/2007 | Lu et al. | |
| 7,420,393 B2 | 9/2008 | Huang et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2006/0033549 A1 * | 2/2006 | Huang | 327/333 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0290470 A1 | 11/2008 | King et al. | |
| 2008/0296632 A1 | 12/2008 | Moroz et al. | |
| 2009/0181477 A1 | 7/2009 | King et al. | |
| 2009/0243697 A1 * | 10/2009 | Funakoshi | 327/333 |

\* cited by examiner

*Primary Examiner* — Long Nguyen
(74) *Attorney, Agent, or Firm* — Duane Morris LLP

(57) ABSTRACT

A level shifter includes first and second NMOS transistors with gates connected to inverted circuit and circuit inputs, respectively, sources connected to the ground, and drains connected to circuit and inverted circuit outputs, respectively. First and second PMOS transistors have their gates connected to the inverted circuit and circuit outputs, respectively, and sources connected to the high voltage supply. A third PMOS transistor of the multiple independent gate type has its source connected to the drain of the first PMOS transistor, drain and back-gate connected to the circuit output, and front-gate connected to the inverted circuit input. A fourth PMOS transistor of the multiple independent gate type has its source connected to the drain of the second PMOS transistor, drain and back-gate connected to the inverted circuit output, and front-gate connected to the circuit input.

20 Claims, 3 Drawing Sheets

LEVEL SHIFTER

FIELD OF THE INVENTION

The present invention relates to level shifters, and particularly level shifters for interfacing between ultra-low voltage domains and a high voltage domain.

BACKGROUND OF THE INVENTION

Level shifter devices are widely used components in digital circuits for communicating between two different power domains, one being a low voltage domain (LV) and the other being a high voltage (HV) domain. In digital circuits such as static random access memory (SRAM), low Vcc-min operation of the level shifter is crucial. These low Vcc-min designs, which result in large HV-LV gaps, present operational difficulties for the level shifter. Current level shifter designs suffer operation difficulties with large HV-LV gaps found in ultra-low voltage logic devices.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Terms concerning electrical attachments, coupling and the like, such as "connected" and "interconnected," refer to a relationship wherein structures communicate with one another either directly or indirectly through intervening structures, unless expressly described otherwise.

Figure 1:
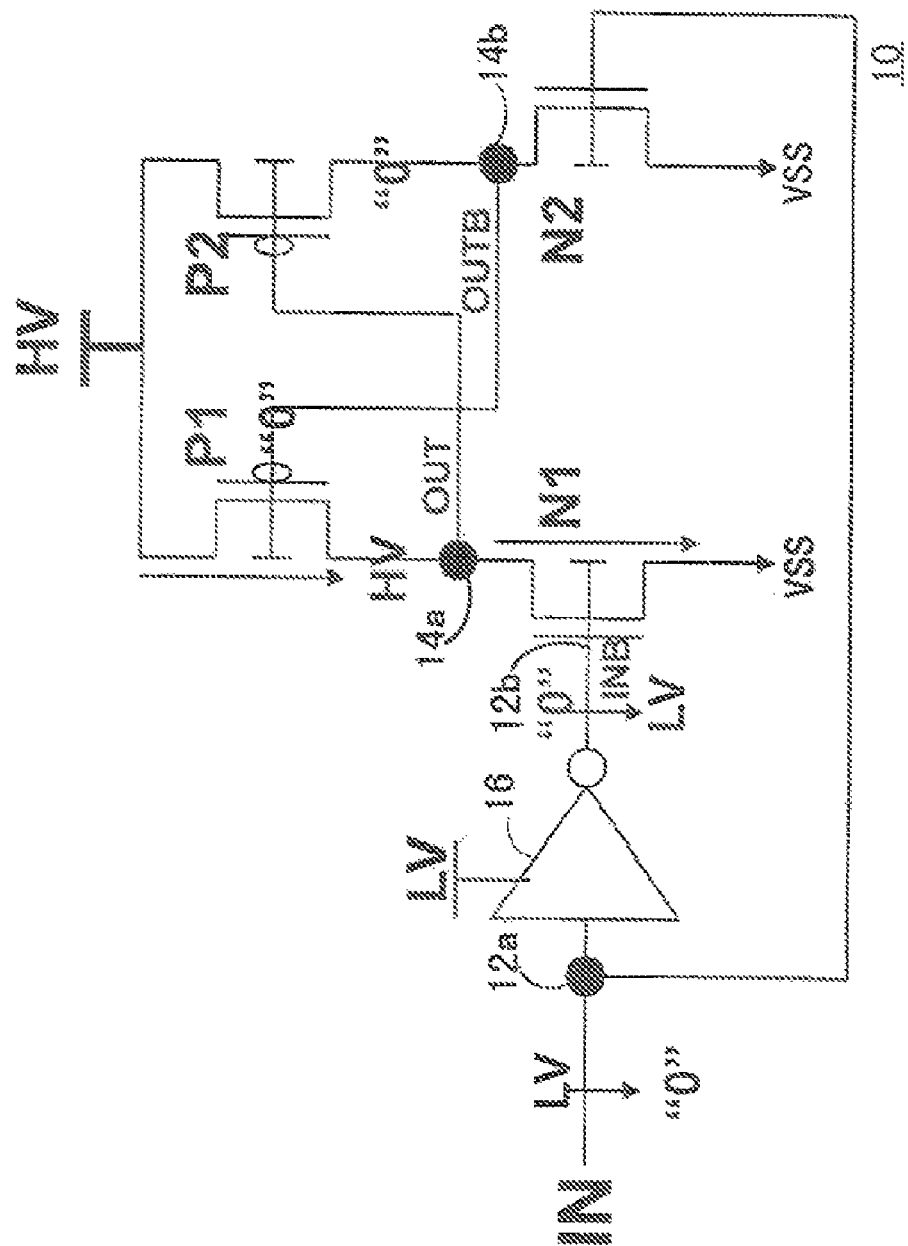
FIG. 1 is a circuit diagram of one conventional level shifter.

FIG. 1 is a circuit diagram of a conventional level shifter circuit 10. The level shift circuit 10 interfaces between a low voltage (LV) domain input at nodes 12a, 12b and the high voltage (HV) domain output at nodes 14a, 14b. The level shift circuit 10 includes an inverter 16 operating in the LV domain for providing inverted input signal INB from input signal "IN". Corresponding HV domain output signals OUT and OUTB are provided at nodes 14a and 14b. The level shifter includes a pair of PMOS pull-up transistor P1 and P2 as shown in FIG. 1 forming a closed P-latch circuit. Each PMOS transistor has its source terminal coupled to a HV power supply and its gate terminal cross-coupled to the drain terminal of the other PMOS transistor. That is, the drain terminal of transistor P1 at node 14a is coupled to the gate terminal of transistor P2 and the drain terminal of transistor P2 at node 14b is coupled to the gate terminal of transistor P1. Input pull-down transistors N1 and N2 are also shown in FIG. 1. These transistors are connected in a cascade connection to transistors P1 and P2, respectively. NMOS transistor N1 has its drain terminal connected to node 14a, and thus to the drain terminal of PMOS P1 and gate of PMOS P2, its gate terminal connected to node 12b to receive INB, and its source terminal connected to a VSS supply voltage (i.e., ground). Similarly, NMOS transistor N2 has its drain terminal connected to node 14b, and thus to the drain terminal of PMOS P2 and gate of PMOS P1, its gate terminal connected to node 12a to receive IN, and its source terminal connected to VSS.

The inverter 16 can include a NMOS transistor and a PMOS transistor that can be low voltage transistors. Transistors N1, P1, N2 and P2 can be high voltage transistors. The operation of level shifter 10 is described below.

Assume IN is a logical "1". INB is the inversion of IN so INB is logical "0". When INB is 0, transistor N1 is off and N2 is on. With N2 on, node 14b is set low (i.e., VSS). Transistor P1 is on, setting node 14a high (i.e., HV). Transistor P2 is off.

Assume IN is a logical "0". INB is the inversion of IN so INB is logical "1". When INB is 1, transistor N1 is on and N2 is off. With N1 on, node 14a is set low (i.e., VSS). Transistor P2 is on, setting node 14b high (i.e., HV). Transistor P1 is off.

The level shifter 10 of FIG. 1 suffers from a NMOS/PMOS fighting issue when signal IN transitions from logical high (level LV) to 0 (and thus INB from 0 to LV) and vice versa. When signal IN transitions from high to low, transistor N1 is forced to turn on. However, transistor P1 is already "on". So, transistor N1 and transistor P1 fight one another. That is, while N1 tries to pull node 14a low transistor P1 tries to keep node 14a high. If transistor P1 is stronger than transistor N1, then the circuit will fail since transistor N1 will be unable to pull node 14a low. But if transistor P1 is too weak, the speed of the circuit will degrade. That is, when the input IN is going from low to high (LV), then a weak P1 will pull node 14a high (HV) slowly.

This NMOS/PMOS fighting issue presents a significant challenge as the HV-LV gap continues to grow in deep submicron circuits. For example, in a 28 nm generation technology, HV may be 0.9V and LV may be 0.5 V, providing a large 0.4 V gap. The conventional level shifter 10 will encounter significant fighting issues under these conditions. This conventional design may also fail to operate entirely under larger HV-LV gaps.

Figure 2:
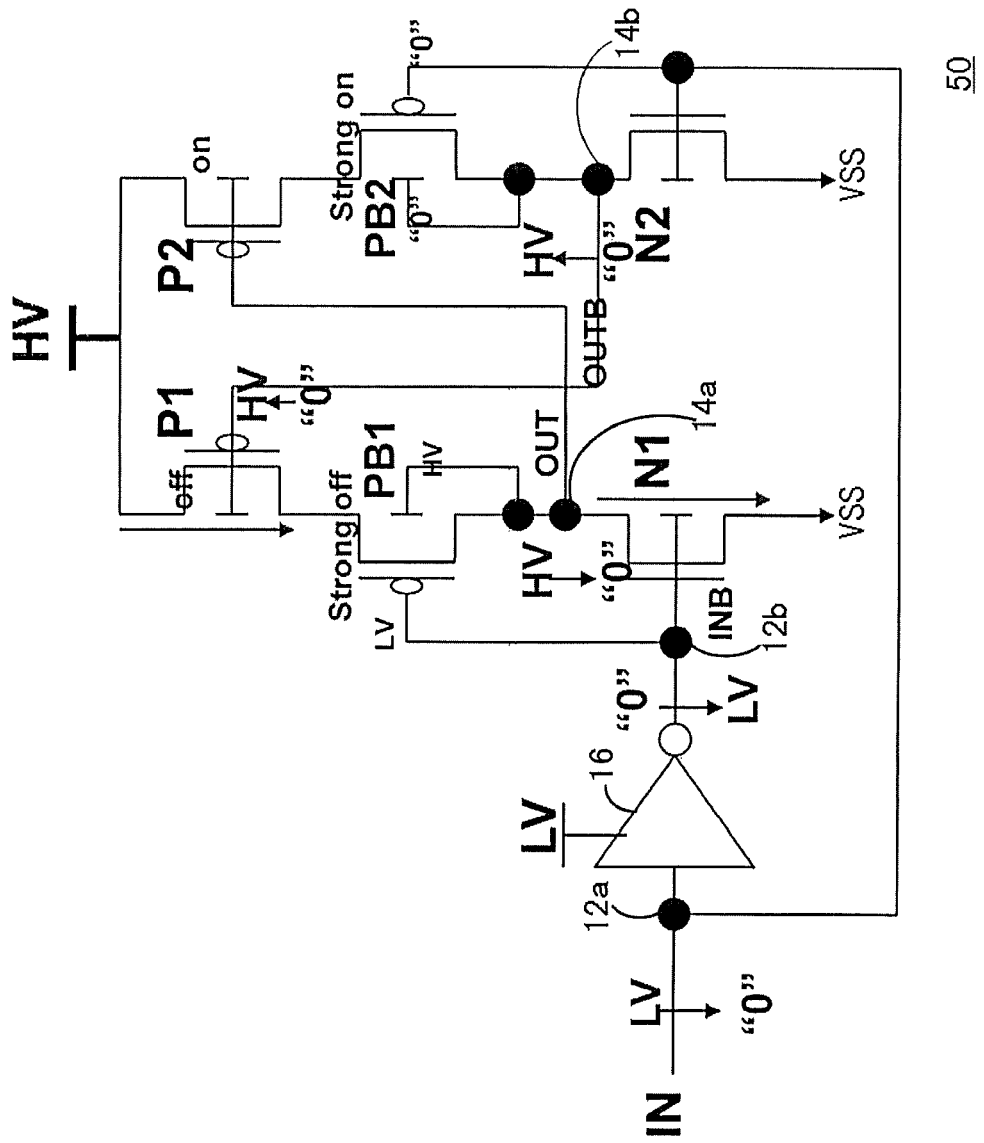
FIG. 2 is a circuit diagram of a level shifter according to an embodiment of the present invention.

FIG. 2 illustrates an embodiment of an improved level shifter 50 for improved performance with ultra-low VCC-min devices. The level shifter 50 is identical to level shifter 10 except for the utilization of a positive self-feedback connection via the addition of a pair of multi-gate PMOS transistors PB1 and PB2. More specifically, with reference to FIG. 2, multi-gate transistors PB1 and PB2 are shown as double-gate transistors. These transistors can be high voltage transistors. Transistor PB1 is coupled between transistors P1 and N1 with its source terminal coupled to the drain of transistor P1 and its drain terminal coupled to the drain transistor N1 at output node 14a. The front-gate of the transistor PB1 is coupled to input node 12b to be driven by inverted input signal INB, and the back-gate of PB1 is coupled to output node 14a to be driven by a feedback signal, i.e., OUT. Transistor PB2 is coupled between transistors P2 and N2 with its source terminal coupled to the drain of transistor P2 and its drain terminal coupled to the drain of transistor N2 at output node 14b. The front-gate of the transistor PB2 is coupled to input node 12a to be driven by input signal IN, and the back-gate of PB2 is coupled to output node 14b to be driven by a feedback signal, i.e., OUTB.

Double-gate transistor PB1 and PB2 may be FINFET devices, and more preferably multiple independent gate FET (MIGFET) devices. MIGFET devices employ independent gate electrodes. The gain of the MIGFET is highest when both front and back-gates are tied to the same bias. The gain is sensitive to the back-gate bias, meaning the strength of the transistor can be modulated by the bias at the back-gate. Transistors P1, P2, N1 and N2 may also be double-gate transistors, such as FINFET devices, only with single gate control.

The operation of level shifter 50 is discussed below.

Assume IN is logical "1". INB is the inversion of IN so INB is logical "0". When INB is 0, transistor N1 is off and transistor N2 is on. With N2 on, node 14b is set low (i.e., VSS). Transistor P1 is "on". Transistor PB1 has its front-gate biased with INB (i.e., 0) and its back-gate biased by signal OUT at node 14a (i.e., by HV). Transistor PB1 is thus weekly "on". Node 14a is pulled high to HV. With node 14a high, transistor P2 is "off". Transistor PB2 has its front-gate biased with LV and its back-gate biased with "0". Because its front-gate is biased with LV, transistor PB2 is weekly "off", though PB2 plays no significant role under these conditions since P2 is "off".

Assume IN is logical "0". INB is the inversion of IN so INB is logical "1". When INB is logical 1, transistor N1 is on and transistor N2 is off. With transistor N1 on, node 14a is pulled low (i.e., VSS). With node 14a low, transistor P2 is "on". Transistor PB2 has its front-gate biased with IN (i.e., 0) and its back-gate biased by node 14b (i.e., by HV). Transistor PB2 is thus weekly "on". Node 14b is pulled high to HV. With node 14b high, transistor P1 is "off". Transistor PB1 has its front-gate biased with LV and its back-gate biased with "0". Because its front-gate is biased with LV, transistor PB1 is weekly "off".

Now, assume signal IN is transitioning from logical high ("1"), i.e., LV, to logical low ("0"). INB transitions from "0" to "1". This turns transistor N1 on. The front-gate of PB1 is LV and the back-gate is HV. With both gates biased with logical "1", this puts transistor PB1 in a strongly "off" state. As such, transistor N1 and transistor P1 are effectively isolated from one another, thus minimizing the fighting between transistors N1 and P1. Unencumbered by transistor P1, signal OUT at node 14a is pulled to "0" by transistor N1, which turns on transistor P2. Both the front and back-gates of transistor PB2 are logical low "0", which places transistor PB2 in a strongly on state. Transistor PB2 assists in pulling node OUTB from "0" to high (i.e., HV). This transition from low to high is quicker than the conventional design because of the assistance of transistor PB2.

In summary, when IN transitions from high to low, blocking transistor PB1 isolates transistor N1 from transistor P1, allowing N1 to pull OUT to "0" without fighting transistor P1, and blocking transistor PB2 helps transistor P2 pull OUTB high quickly to HV (logical "1").

It should be apparent that when IN transitions from low to high, blocking transistor PB2 isolates transistor N2 from transistor P2, allowing N2 to pull OUTB to "0" without fighting transistor P2, and blocking transistor PB1 helps transistor P1 pull OUT high quickly to HV (logical "1").

Figure 3:
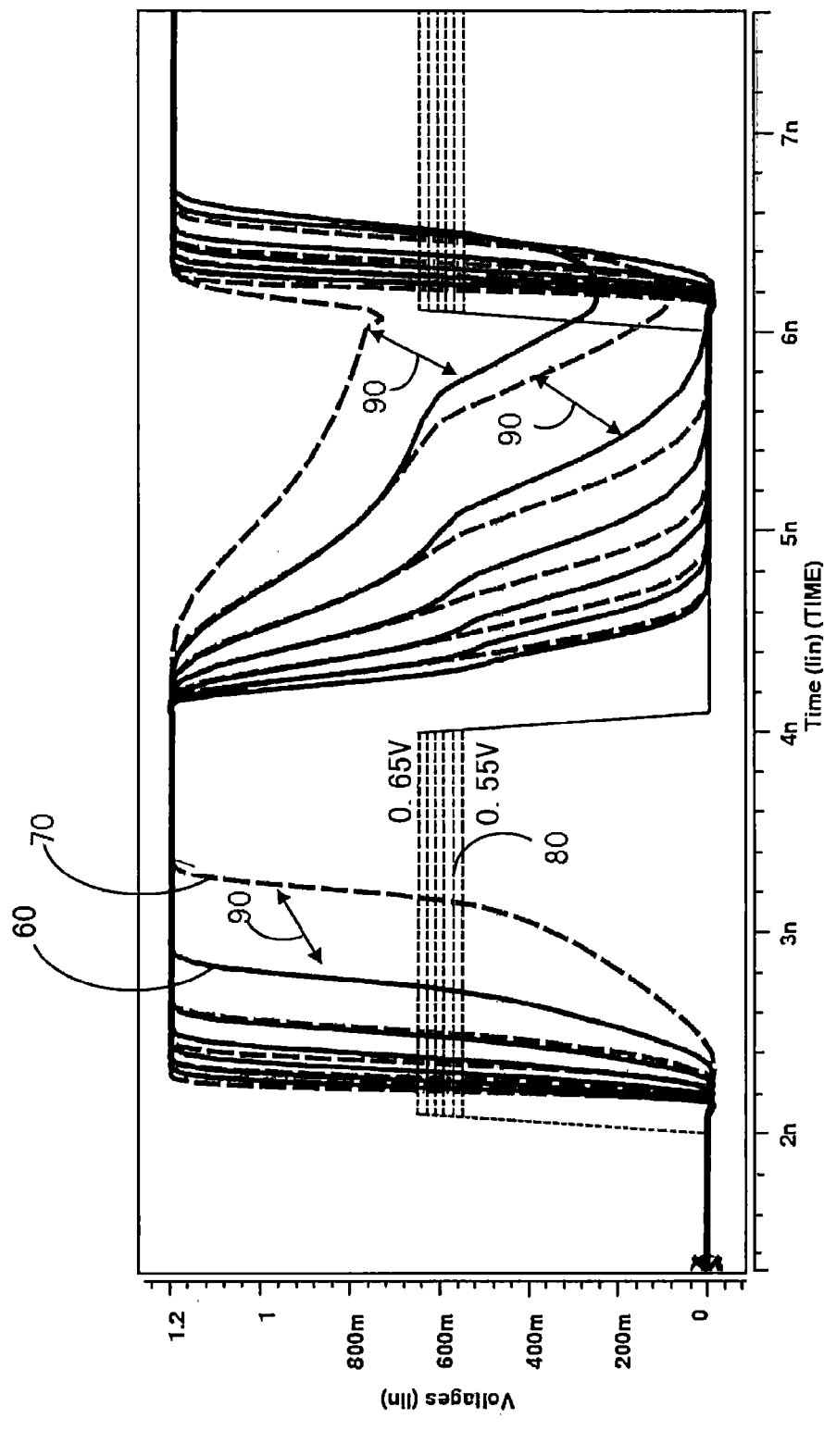
FIG. 3 is a plot illustrating the results of a simulation of the level shifter of FIG. 2 and one other level shifter design.

The level shifter design of FIG. 2 was tested against a tri-gate design for a level shifter, which does not utilize double-gate transistors with independent control of front and back gates. The simulation results are shown in FIG. 3. Solid line 60 represents the plotted waveform from the simulated level shifter of FIG. 2 whereas the dashed line 70 represents the plotted waveform for the simulated tri-gate level shifter. Waveform 80 is the value of LV, which was swept from 0.55 V to 0.65 V while HV was held at 1.2 V. This represents an HV-LV gap of 0.65 V to 0.55 V.

Conventional level shifters, such as that shown in FIG. 1, can only operate when LV goes as low as about 0.8 V, representing an HV-LV gap of 0.4 V, and thus these conventional designs were not included in the simulation. The simulation shows that the proposed level shifter 50 performs wells even when LV is lower than 0.6 V (i.e., at a HV-LV gap of 0.6V or greater). The simulations also showed that the proposed level shifter performed even better than the tri-gate approach in terms of transient speed, as indicated by gaps 90.

The level shifter described herein can effectively level shift between ultra-low voltage domains to a high voltage domain. In embodiments, the level shifter utilizes multiple independent gate transistors with self-feedback control to minimize the fighting issue between pull up and pull down transistors in the level shifter. The level shifter is thus ideally suited for low VCC-min logic devices such as SRAM devices where power savings are critical.

As described above, in one embodiment a level shifting circuit is provided that includes: a circuit input that swings between a low voltage supply and ground; a circuit output that swings between a high voltage supply and the ground; an inverter with an inverter input connected to the circuit input and an inverter output forming an inverted circuit input; a first NMOS transistor with gate connected to the inverted circuit input, with source connected to the ground, and with drain connected to the circuit output; a second NMOS transistor with gate connected to the circuit input and with source connected to the ground; a first PMOS transistor with gate connected to the second NMOS transistor drain and with source connected to the high voltage supply; a second PMOS transistor with gate connected to the circuit output and with source connected to the high voltage supply; a third PMOS transistor, the third PMOS transistor being of the multiple independent gate type, with source connected to the drain of the first PMOS transistor, with drain and back-gate connected to the circuit output, and with front-gate connected to the inverted circuit input; and a fourth PMOS transistor, the fourth PMOS transistor being of the multiple independent gate type, with source connected to the drain of the second PMOS transistor, with drain and back-gate connected to the second NMOS transistor drain, and with front-gate connected to the circuit input. In embodiments, the In another embodiment, a level shifting circuit includes: a circuit input that swings between a low voltage supply and ground; a circuit output that swings between a high voltage supply and the ground; an inverted circuit output; an inverter with an inverter input connected to the circuit input and an inverter output forming an inverted circuit input; a first NMOS transistor with gate connected to the inverted circuit input, with source connected to the ground, and with drain connected to the circuit output; a second NMOS transistor with gate connected to the circuit input, with source connected to the ground, and with drain connected to the inverted circuit output; a first PMOS transistor with gate connected to the inverted circuit output and with source connected to the high voltage supply; a second PMOS transistor with gate connected to the circuit output and with source connected to the high voltage supply; a third PMOS transistor, the third PMOS transistor being of the double independent gate type, with source connected to the drain of the first PMOS transistor, with drain and back-gate connected to the circuit output, and with front-gate connected to the inverted circuit input; and a fourth PMOS transistor, the fourth PMOS transistor being of the double independent gate type, with source connected to the drain of the second PMOS transistor, with drain and back-gate connected to the inverted circuit output, and with front-gate connected to the circuit input.

In certain embodiments, the low voltage supply is less than 0.8 V. In certain further embodiments, the low voltage supply is less than or equal to about 0.6 V. In embodiments, the high voltage supply is at or above about 1.0 V, and in other embodiments at or above about 1.2 V. In certain embodiments the difference between the low and high voltage supplies is greater than 0.4 V and in other embodiments it is greater than or equal to about 0.55 V, and in yet other embodiments it is greater than or equal to about 0.6 V.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A level shifting circuit comprising:
a circuit input that swings between a low voltage supply and ground;
a circuit output that swings between a high voltage supply and the ground;
an inverter with an inverter input connected to the circuit input and an inverter output forming an inverted circuit input;
a first NMOS transistor with gate connected to the inverted circuit input, with source connected to the ground, and with drain connected to the circuit output;
a second NMOS transistor with gate connected to the circuit input and with source connected to the ground;
a first PMOS transistor with gate connected to the second NMOS transistor drain and with source connected to the high voltage supply;
a second PMOS transistor with gate connected to the circuit output and with source connected to the high voltage supply;
a third PMOS transistor, the third PMOS transistor being of the multiple independent gate type, with source connected to the drain of the first PMOS transistor, with drain and back-gate connected to the circuit output, and with front-gate connected to the inverted circuit input; and
a fourth PMOS transistor, the fourth PMOS transistor being of the multiple independent gate type, with source connected to the drain of the second PMOS transistor, with drain and back-gate connected to the second NMOS transistor drain, and with front-gate connected to the circuit input.

2. The circuit of claim 1, wherein the inverter comprises a NMOS transistor and a PMOS transistor.

3. The circuit according to claim 2, wherein said NMOS transistor and said PMOS transistor are low voltage transistors.

4. The circuit according to claim 1, wherein said first and second NMOS transistors and said first, second, third and fourth PMOS transistors are high voltage transistors.

5. The circuit of claim 1, wherein the low voltage supply is less than 0.8 V.

6. The circuit of claim 1, wherein the low voltage supply is less than or equal to about 0.6 V.

7. The circuit according to claim 1, wherein said high voltage supply is greater than or equal to about 1.0 V.

8. The circuit according to claim 1, wherein said high voltage supply is greater than or equal to about 1.2 V.

9. The circuit according to claim 1, further comprising an inverted circuit output connected to the drain of the second NMOS transistor that swings between a high voltage supply and the ground.

10. The circuit according to claim 1, wherein a difference between the low and high voltage supplies is greater than 0.4 V.

11. The circuit according to claim 1, wherein a difference between the low and high voltage supplies is greater than or equal to about 0.55 V.

12. A level shifting circuit comprising:
a circuit output that swings between a high voltage supply and the ground;
an inverted circuit output;
an inverter with an inverter input connected to the circuit input and an inverter output forming an inverted circuit input;
a first NMOS transistor with gate connected to the inverted circuit input, with source connected to the ground, and with drain connected to the circuit output;
a second NMOS transistor with gate connected to the circuit input, with source connected to the ground, and with drain connected to the inverted circuit output;
a first PMOS transistor with gate connected to the inverted circuit output and with source connected to the high voltage supply;
a second PMOS transistor with gate connected to the circuit output and with source connected to the high voltage supply;
a third PMOS transistor, the third PMOS transistor being of the double independent gate type, with source connected to the drain of the first PMOS transistor, with drain and back-gate connected to the circuit output, and with front-gate connected to the inverted circuit input; and
a fourth PMOS transistor, the fourth PMOS transistor being of the double independent gate type, with source connected to the drain of the second PMOS transistor, with drain and back-gate connected to the inverted circuit output, and with front-gate connected to the circuit input.

13. The circuit of claim 12, wherein the inverter comprises low voltage devices.

14. The circuit according to claim 13, wherein said first and second NMOS transistors and said first, second, third and fourth PMOS transistors are high voltage transistors.

15. The circuit of claim 12, wherein the low voltage supply is less than 0.8 V.

16. The circuit of claim 12, wherein the low voltage supply is less than or equal to about 0.6 V.

17. The circuit according to claim 16, wherein said high voltage supply is greater than or equal to about 1.0 V.

18. The circuit according to claim 16, wherein said high voltage supply is greater than or equal to about 1.2 V.

19. The circuit according to claim 12, wherein a difference between the low and high voltage supplies is greater than 0.4 V.

20. The circuit according to claim 1, wherein a difference between the low and high voltage supplies is greater than or equal to about 0.55 V.

* * * * *